(12) United States Patent
Grumbine et al.

(10) Patent No.: US 8,497,209 B2
(45) Date of Patent: Jul. 30, 2013

(54) OXIDATION-STABILIZED CMP COMPOSITIONS AND METHODS

(75) Inventors: Steven K. Grumbine, Aurora, IL (US); Renjie Zhou, Aurora, IL (US); Zhan Chen, Aurora, IL (US); Phillip W. Carter, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 528 days.

(21) Appl. No.: 12/764,268

(22) Filed: Apr. 21, 2010

(65) Prior Publication Data
US 2010/0200802 A1 Aug. 12, 2010

Related U.S. Application Data

(62) Division of application No. 11/384,538, filed on Mar. 20, 2006, now Pat. No. 7,732,393.

(51) Int. Cl.
*H01L 21/302* (2006.01)
*H01L 21/321* (2006.01)

(52) U.S. Cl.
CPC ................ *H01L 21/3212* (2013.01)
USPC ............ 438/692; 252/79.1; 216/89; 510/175

(58) Field of Classification Search
USPC ............ 252/79.1; 438/692; 216/89; 510/175
See application file for complete search history.

(56) References Cited

U.S. PATENT DOCUMENTS

| | | | |
|---|---|---|---|
| 5,610,250 A | 3/1997 | Veregrin et al. | |
| 6,194,366 B1 | 2/2001 | Naghshineh et al. | |
| 6,641,630 B1 * | 11/2003 | Sun | 51/307 |
| 6,660,639 B2 | 12/2003 | Li et al. | |
| 6,786,945 B2 | 9/2004 | Machii et al. | |
| 6,863,797 B2 | 3/2005 | Sun et al. | |
| 6,869,336 B1 | 3/2005 | Hardikar | |
| 7,097,541 B2 * | 8/2006 | DeRege Thesauro et al. | 451/36 |
| 7,316,603 B2 * | 1/2008 | Carter et al. | 451/56 |
| 7,732,393 B2 * | 6/2010 | Grumbine et al. | 510/175 |
| 7,998,335 B2 * | 8/2011 | Feeney et al. | 205/674 |
| 2002/0031985 A1 | 3/2002 | Wang et al. | |
| 2003/0181142 A1 | 9/2003 | De Rege et al. | |
| 2004/0067649 A1 | 4/2004 | Hellring et al. | |
| 2005/0076580 A1 | 4/2005 | Tamboli et al. | |
| 2005/0178742 A1 | 8/2005 | Chelle | |

(Continued)

FOREIGN PATENT DOCUMENTS

| EP | 0896042 | 2/1999 |
|---|---|---|
| EP | 1137056 | 9/2001 |

OTHER PUBLICATIONS

Hariharaputhiran et al., "Hydroxyl Radical Formation in H2O2-Amino Acid Mixtures and Chemical Mechanical Polishing" J. Eiectrochem. Soc., vol. 147(10), pp. 3820-3826 (2000).

*Primary Examiner* — Gregory Webb
(74) *Attorney, Agent, or Firm* — Thomas E Omholt; Steven D Weseman

(57) ABSTRACT

The present invention provides a chemical-mechanical polishing (CMP) composition comprising an amino compound, a radical-forming oxidizing agent, a radical trapping agent capable of inhibiting radical-induced oxidation of the amino compound, and an aqueous carrier therefore. The radical trapping agent is a hydroxyl-substituted polyunsaturated cyclic compound, a nitrogenous compound, or a combination thereof. Optionally, the composition comprises a metal oxide abrasive (e.g., silica, alumina, titania, ceria, zirconia, or a combination of two or more of the foregoing abrasives).

9 Claims, 2 Drawing Sheets

U.S. PATENT DOCUMENTS

| | | |
|---|---|---|
| 2006/0030158 A1* | 2/2006 | Carter et al. .................. 438/692 |
| 2006/0096179 A1* | 5/2006 | Lu et al. .......................... 51/307 |
| 2006/0144824 A1* | 7/2006 | Carter et al. .................... 216/89 |
| 2006/0196848 A1* | 9/2006 | Carter et al. .................... 216/88 |
| 2006/0281196 A1* | 12/2006 | Feeney et al. ..................... 438/5 |
| 2007/0060490 A1 | 3/2007 | Skee |
| 2007/0219104 A1* | 9/2007 | Grumbine et al. ............ 510/175 |

* cited by examiner

OXIDATION-STABILIZED CMP COMPOSITIONS AND METHODS

This application is a divisional of U.S. application Ser. No. 11/384,538, which was filed Mar. 20, 2006 now U.S. Pat. No. 7,732,393, and published Sep. 20, 2007 as U.S. 2007/0219104.

FIELD OF THE INVENTION

This invention relates to polishing compositions and methods for polishing a substrate using the same. More particularly, this invention relates to stabilized chemical-mechanical polishing compositions containing amines and radical-forming oxidizing agents compositions and chemical-mechanical polishing methods utilizing the compositions.

BACKGROUND OF THE INVENTION

Compositions and methods for chemical-mechanical polishing (CMP) the surface of a substrate are well known in the art. Polishing compositions (also known as polishing slurries, CMP slurries, and CMP compositions) for CMP of metal-containing surfaces of semiconductor substrates (e.g., integrated circuits) typically contain an oxidizing agent, various additive compounds, abrasives, and the like.

In conventional CMP techniques, a substrate carrier or polishing head is mounted on a carrier assembly and positioned in contact with a polishing pad in a CMP apparatus. The carrier assembly provides a controllable pressure to the substrate, pressing the substrate against the polishing pad. The pad is moved relative to the substrate by an external driving force. The relative movement of the pad and substrate serves to abrade the surface of the substrate to remove a portion of the material from the substrate surface, thereby polishing the substrate. The polishing of the substrate by the relative-movement of the pad and the substrate typically is further aided by the chemical activity of the polishing composition (e.g., by oxidizing agents present in the CMP composition) and/or the mechanical activity of an abrasive suspended in the polishing composition.

A surface of a substrate is abraded to polish the surface by contacting the surface with a polishing pad and moving the polishing pad relative to the surface, while maintaining a CMP slurry between the pad and the surface. Typical abrasive materials include silicon dioxide, cerium oxide, aluminum oxide, zirconium oxide, and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

Many integrated circuits utilize metals for electrical connections between various portions of the circuit. Integrated circuit interconnects typically consist of three-dimensional metal lines with submicrometer cross sections, which are surrounded by insulating material. Commonly, the metals chosen for use as circuit interconnections include aluminum and copper for horizontal interconnects, and tungsten and copper for vertical (interlayer) connections. Tantalum and various tantalum compounds (e.g., tantalum nitride) are frequently utilized as barrier layers to prevent migration of copper into underlying silicon, as well. An integrated circuit interconnect might consist of several one-micrometer-thick layers. CMP compositions for polishing metal-containing surfaces generally include variety of other components to aid in removal of excess metals, barrier layers, polysilicon, and the like, such as oxidizing agents, abrasives, and amino-type corrosion inhibitors, such as benzotriazole, and the like.

The pot-life of conventional polishing compositions containing an amine compound (e.g., benzotriazole) and a radical-forming oxidizing agent (e.g., hydrogen peroxide) typically is not entirely satisfactory, since amines are frequently oxidized by radical-forming oxidizing agents. The oxidation of the amines typically reduces the efficiency of the amines to accomplish their intended purpose (e.g., corrosion inhibition).

Accordingly, there is an ongoing need to develop new CMP compositions that contain amines and radical-forming oxidizing agents, and which have improved pot-life compared to conventional CMP compositions. The present invention provides such improved CMP compositions. These and other advantages of the invention, as well as additional inventive features, will be apparent from the description of the invention provided herein.

BRIEF SUMMARY OF THE INVENTION

The present invention provides a chemical-mechanical polishing (CMP) composition comprising an amino compound, a radical-forming oxidizing agent, a radical trapping agent capable of inhibiting radical-induced oxidation of the amino compound, and an aqueous carrier therefor. The radical trapping agent comprises a hydroxyl-substituted polyunsaturated cyclic compound, a nitrogenous compound, or a combination thereof. Optionally, the composition comprises a metal oxide abrasive (e.g. silica, alumina, titania, ceria, zirconia, or a combination of two or more of the foregoing abrasives), as well as other CMP additives.

In some embodiments, the radical trapping agent is a nitrogenous compound selected from the group consisting of an aromatic nitro compound, a heteroaromatic nitro compound, an aliphatic nitro compound, a nitroso compound, a nitrogen free radical-type compound, an N-oxide compound, an N-hydroxyl-imine compound, an acylamino-substituted aromatic compound, an N-acyl-enamine compound, and a combination of two or more of the foregoing nitrogenous compounds.

In other embodiments, the radical trapping agent is a hydroxyl-substituted polyunsaturated cyclic compound. Non-limiting examples of suitable hydroxyl-substituted polyunsaturated cyclic compounds include hydroquinone-type compounds, hydroxyl-substituted quinone compounds, hydroxyl-substituted coumarin compounds, hydroxyl-substituted naphthalene compounds, alkyloxy-substituted phenol compounds, alkyl-substituted phenol compounds, hydroxyl-substituted heteroaromatic compounds, sulfonic acid-substituted phenolic compounds, salts thereof, and a combination of two or more of the foregoing compounds.

Preferably, the radical-forming oxidizing agent comprises at least one oxidizing agent selected from the group consisting of a peroxy compound (e.g., hydrogen peroxide, persulfate compound, and the like) and a halogen compound (e.g., iodine).

The amino compound preferably comprises at least one primary amine group, at least one nitrogen-containing heterocyclic group, at least one quaternary ammonium group, or a combination two or more of the foregoing groups.

In another aspect, the present invention provides a method for chemically-mechanically polishing a substrate. The method comprises the steps of contacting a surface of a substrate with a polishing pad and an aqueous CMP composition, and causing relative motion between the polishing pad and the substrate, while maintaining a portion of the CMP composition in contact with the surface between the pad and the substrate. The relative motion is maintained for a period of time sufficient to abrade at least a portion of the surface. The CMP composition comprises an amino compound, a radical-forming oxidizing agent, a radical trapping agent capable of inhibiting radical-induced oxidation of the amino compound, an aqueous carrier therefor, and optionally, a metal oxide abrasive. The radical trapping agent can be a hydroxyl-substituted polyunsaturated cyclic compound, a nitrogenous compound, or a combination thereof, which is capable of inhibiting oxidation of the amine by the radical forming oxidizing agent.

In yet another aspect, the present invention provides a method of enhancing the pot-life of a CMP composition that includes an amino compound and a radical-forming oxidizing agent. The method comprises adding to the CMP composition an amine oxidation-inhibiting amount of a radical trapping agent comprising a hydroxyl-substituted polyunsaturated cyclic compound, a nitrogenous compound, or a combination thereof.

DETAILED DESCRIPTION OF THE INVENTION

Figure 1:
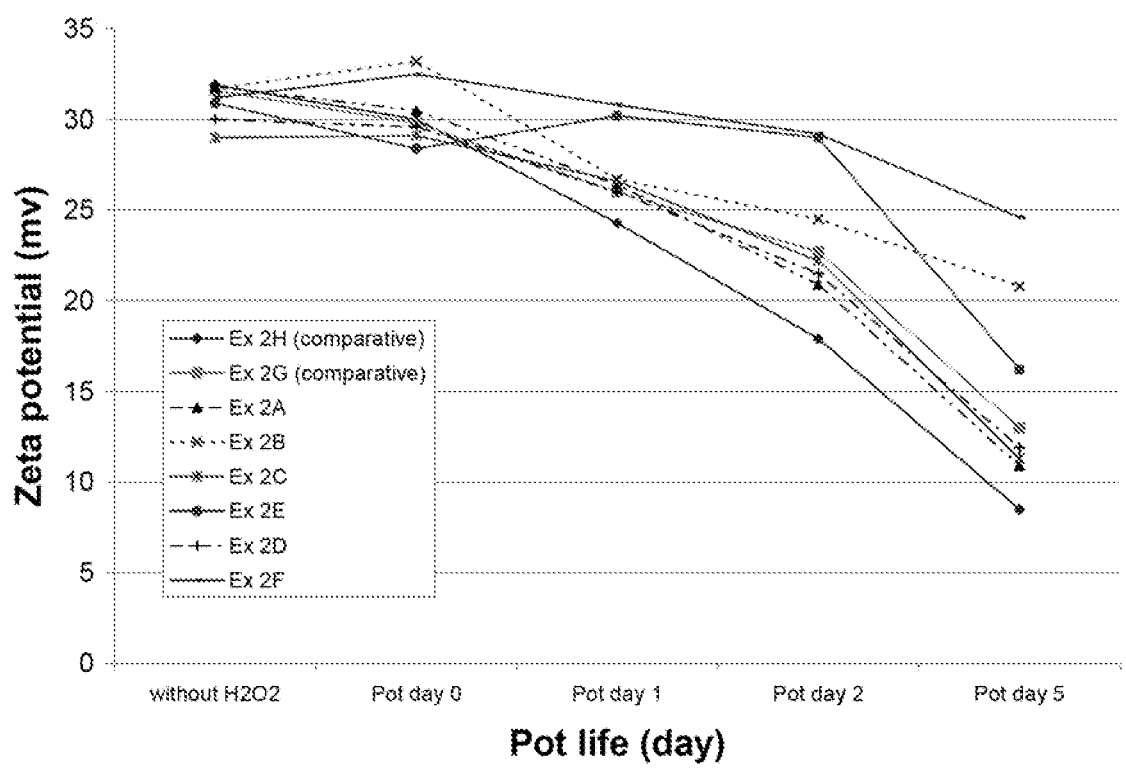
FIG. 1 is a plot of zeta potential of fumed silica versus time after addition of hydrogen peroxide for various CMP compositions of the invention containing different radical trapping agents, compared to a control composition that does not contain a radical trapping agent.

The present invention provides a chemical-mechanical polishing (CMP) composition having improved shelf-life stability. The CMP composition contains an amino compound, a radical-forming oxidizing agent, and a radical trapping agent in an aqueous carrier. The radical trapping agent is capable of inhibiting radical-induced oxidation of the amino compound. The radical trapping agent can be a hydroxyl-substituted polyunsaturated cyclic compound, a nitrogenous compound, or a combination thereof. As one of ordinary skill in the art will readily understand, individual radical trapping agents may fall into one or both of the foregoing categories (i.e., the radical trapping agent can be both a nitrogenous compound and a hydroxyl-substituted polyunsaturated cyclic compound, e.g. 2-hydroxypyridine).

Amino compounds are utilized in the CMP compositions of the invention for a variety of purposes (e.g., as corrosion inhibitors, dispersants, and the like), which are well known in the art. The amino compounds present in the CMP compositions of the present invention include, without limitation, compounds having at least one primary amino group, compounds having at least one nitrogen-containing heterocyclic group, compounds having at least one quaternary ammonium group, or compounds having a combination of two or more of the foregoing groups. Preferably, the amino compound component of the CMP composition is separate and distinct from the radical trapping agent component, which can also be an amino-substituted compound.

Examples of suitable amino compounds include compounds having a primary amino group, nitrogen-containing heterocyclic compounds, (e.g., benzotriazole (BTA), 1,2,4-triazole, imidazole compounds, and the like), and quaternary ammonium compounds (e.g., quaternary ammonium-substituted polymers).

The quaternary ammonium-substituted polymers suitable for use in the CMP compositions of the present invention can be homopolymers or copolymers that include at least one quaternary ammonium-substituted monomer unit. Alternatively, the quaternary ammonium-substituted polymer can be a zwitterionic polymer comprising at least one quaternary ammonium-substituted monomer unit.

The quaternary ammonium-substituted homopolymer can be any suitable homopolymer consisting essentially of quaternary ammonium-substituted monomer repeat units. The quaternary ammonium substituents can be acyclic or incorporated into a ring structure. It is also suitable for the quaternary ammonium-substituted polymer to be further modified by alkylation, acylation, ethoxylation, or other chemical reaction, in order to alter the solubility, viscosity, or other physical parameter of the cationic polymer. Non-limiting examples of quaternary ammonium-substituted homopolymers include polydiallyldimethylammonium halides, poly(methacryloxyloxyethyltrimethylammonium)chloride, and poly(methacryloyloxyethyldimethylbenzylammonium)chloride.

Alternatively, in some embodiments the quaternary ammonium-substituted polymer can be a copolymer comprising at least one quaternary ammonium-substituted monomer and at least one nonionic monomer, wherein the at least one quaternary ammonium-substituted monomer comprises either more than 50% of the copolymer on a molar basis or about 50% or less of the copolymer on a molar basis. The quaternary ammonium-substituted and nonionic monomers can be any suitable, quaternary ammonium-substituted and nonionic monomers.

For example, the quaternary ammonium-substituted monomer can be any suitable quaternary ammonium-substituted monomer(s) comprising quaternized nitrogen. The quaternized ammonium groups on the monomer units can be acyclic or can be incorporated into a ring structure. Examples of quaternary ammonium-substituted monomers useful in the context of the invention include, but are not limited to diallyldimethylammonium halides, methacryloyloxyethyltrimethylammonium chloride, and methacryloyloxyethyldimethylbenzylammonium chloride.

The nonionic monomer, for example, can be any suitable nonionic monomer(s), including, but not limited to ethylene, propylene, ethylene oxide, propylene oxide, styrene, epichlorohydrin, acrylamide, and mixtures thereof.

The quaternary ammonium-substituted copolymer can be prepared by any suitable technique. For example, the copolymer can be produced by free radical, cationic, anionic, or condensation polymerization. The copolymer can be a random copolymer, alternating copolymer, periodic copolymer, block copolymer (e.g., AB, ABA, ABC, etc.), graft copolymer, or comb copolymer. The quaternary ammonium-substituted copolymer can be further modified by alkylation, acylation, ethoxylation, or other chemical reaction, in order to alter the solubility, viscosity, or other physical parameter of the copolymer.

As used herein, the term "quaternary ammonium-substituted polymer" also encompasses zwitterionic polymers (i.e., polymers having quaternary ammonium-substituted and anionic functional groups in the same polymer), such as poly [(N-3-sulfopropyl)-N-methacrylamidopropyl-N,N-dimethyl ammonium betaine], poly[(N-3-sulfopropyl)-N-methacryloxyethyl-N,N-dimethyl ammonium betaine], copolymers thereof, and the like.

The quaternary ammonium-substituted polymer (i.e., a homopolymer or copolymer) can have any suitable weight average molecular weight. Preferably, the cationic polymer will have a weight average molecular weight of about 1,000 Daltons or more, as determined by gel permeation chromatography, light scattering, kinematic viscosity, or any other method appropriate for the particular polymer being utilized in the polyoxometalate complex. Methods of determining the molecular weights and molecular weight distributions of polymers are well known in the polymer art.

Other amino compounds useful in the compositions and methods of the present invention include, without limitation, nitrogen-containing heterocyclic compounds (e.g., benzotriazole, substituted benzotriazoles, 1,2,4-triazole, and substituted 1,2,4-triazoles) primary amine compounds (e.g., diamines such as ethylene diamine, 1,4-bis(3-aminopropyl) piperazine, 4,7,10-trioxamidecane-1,13-diamine), and the like.

Preferably, the amino compound is present in the CMP composition of the invention in an amount in the range of about 0.001 to about 0.1 percent by weight, more preferably about 0.005 to about 0.05 percent by weight.

Radical-forming oxidizing agents suitable for use in the CMP compositions and methods of the present invention include peroxy compounds and halogens. Preferred peroxy compounds include hydrogen peroxide and persulfate salts (e.g., ammonium monopersulfate, ammonium dipersulfate, potassium monopersulfate, and potassium dipersulfate). Preferred halogens include iodine. Preferably, the radical-forming oxidizing agent is present in the composition in an amount in the range of about 0.005 to about 10 percent by weight, more preferably about 0.01 to about 5 percent by weight.

The radical trapping agent is present in a CMP composition of the present invention in an amount sufficient to inhibit oxidation of the amino compound, for example in an amount sufficient to decrease the amount of oxidation of the amino group by about 20% or more over a five-day storage period, preferably by about 50% or more over a five-day storage period after addition of a radical-forming oxidizing agent, at ambient room temperature (e.g., 20 to 25° C.). Preferably, the radical-trapping agent is present in the CMP composition in an amount in the range of about 0.00001 molar to about 0.1 molar, more preferably about 0.001 molar to about 0.05 molar.

Non-limiting examples of suitable nitrogenous radical trapping agents include aromatic nitro compounds (e.g., 3,5-dinitrobenzoic acid), heteroaromatic nitro compounds (e.g., 2-methyl-4-nitro imidazole), aliphatic nitro compounds (e.g., tris(hydroxymethyl)nitromethane), nitroso compounds (e.g., 1-nitroso-2-naphthol), nitrogen free radical-type compounds (e.g., a nitroxide compound such as 2,2,6,6-tetramethyl-1-piperidinyloxy free, radical, also known as TEMPO, and 4-hydroxy-TEMPO), N-oxide compounds (e.g., imidazole-N-oxide; 1-(2-hydroxymethyl)piperazine-N-oxide; and N-methylmorpholine-N-oxide), N-hydroxyl-imine compounds (e.g., N-hydroxyphthalimide), acylamino-substituted aromatic compounds (e.g., acetanilide and N-acetyl-5-methoxytryptamine), N-acyl-enamine compounds (e.g., uric acid), and a combination of two or more of the foregoing nitrogenous compounds. Preferably, nitrogen free radical-type radical trapping agents (e.g., TEMPO, and the like) have a free radical half-life of at least about 0.01 seconds, more preferably at least about 1 second, most preferably at least about 10 seconds, in aqueous solution at an ambient room temperature in the range of about 20 to about 25° C. A preferred nitrogenous radical trapping agent is acetanilide. As one of ordinary skill in the art will readily understand, individual nitrogenous radical trapping agents may fall into one or more of the foregoing categories.

Formation of a complex between the radical trapping agent and one or more metal ion during the CMP process can lead to undesirable increases in the polishing rate, and/or can deactivate the radical trapping agent (i.e., reduce its efficiency for inhibiting amine oxidation). Accordingly, it is preferred that the nitrogenous radical trapping agent does not readily form complexes with metal ions, such as copper. In a preferred embodiment, the nitrogenous radical trapping agent has a copper-ligand formation constant of less than about 8, more preferably less than about 5.

Non-limiting examples of suitable hydroxyl-substituted polyunsaturated cyclic radical trapping agents include hydroquinone-type compounds (e.g., 1,4-hydroquinone, propyl gallate), hydroxyl-substituted quinone compounds (e.g., 2,5-dihydroxybenzoquinone; 1,5-diamino-4,8-dihydroxy-anthraquinone disulfonic acid; hydroxyquinone sulfonic acid; and salts thereof), hydroxyl-substituted coumarin compounds (e.g., 4-methyl-7-hydroxycoumarin, also known as 4-methylumbelliferone), hydroxyl-substituted naphthalene compounds (e.g., 3-hydroxy-2-naphthoic acid; and salts thereof), alkyloxy-substituted phenol compounds (e.g. 4-methoxyphenol), alkyl-substituted phenol compounds, hydroxyl-substituted heteroaromatic compounds (e.g., 2-hydroxypyridine), sulfonic acid substituted phenolic compounds, salts thereof (i.e., salts of any of the foregoing compounds) and a combination of two or more of the foregoing compounds. Preferred hydroxyl-substituted polyunsaturated cyclic radical trapping agents include hydroquinone-type compounds, hydroxyl-substituted quinone compounds, alkyloxy-substituted phenol compounds, and sulfonic acid substituted phenolic compounds, as described above. As one of ordinary skill in the art will readily understand, individual hydroxyl-substituted polyunsaturated cyclic radical trapping agents may fall into one or more of the foregoing categories.

Preferably, the hydroxyl-substituted polyunsaturated cyclic radical trapping agent does not readily form complexes with metal ions. In a preferred embodiment, the hydroxyl-substituted polyunsaturated cyclic radical trapping agent has a copper-ligand formation constant of less than about 10, more preferably less than about 8, most preferably less than about 5.

Optionally, the composition comprises a metal oxide abrasive. Suitable abrasives include silica, alumina, titania, ceria, zirconia, or a combination of two or more of the foregoing abrasives), which are well known in the CMP art. Preferred metal oxide abrasives include colloidal silica, fumed silica, and alumina.

An abrasive is preferably present in the CMP compositions of the invention in an amount in the range of about 0.001 to about 20 percent by weight. In some embodiments the amount of abrasive present in the CMP composition is in the range of about 0.01 to about 5 percent by weight. In other embodiments the amount of abrasive is in the rage of about 0.1 to about 1 percent by weight.

The abrasive desirably is suspended in the CMP composition, more specifically in the aqueous component of the CMP composition. When the abrasive is suspended in the CMP composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand without agitation for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of [B]–[T]/[C] desirably is less than or equal to 0.3, and preferably is less than or equal to 0.1.

The CMP compositions of the invention preferably have a pH in the range of about 2 to about 11. The CMP compositions can optionally comprise one or more pH buffering materials, for example, ammonium acetate, disodium citrate, and the like. Many such pH buffering materials are well known in the art. For copper CMP applications, the composition preferably has a pH in the range of about 5 to about 10. For tungsten CMP applications, the composition preferably has a pH in the range of about 2 to about 4.

The CMP compositions of the invention also optionally can comprise one or more additives, such as a surfactant, a rheological control agent (e.g., a viscosity enhancing agent or coagulant), a biocide, and the like, many of which are well known in the CMP art.

The CMP compositions of the invention can be prepared by any suitable technique, many of which are known to those skilled in the art. The CMP composition can be prepared in a batch or continuous process. Generally, the CMP composition can be prepared by combining the components thereof in any order. The term "component" as used herein includes individual ingredients (e.g., acids, bases, and the like) as well as any combination of ingredients (e.g., acids, bases, surfactants, and the like). For example, an abrasive can be dispersed in water, and the amino compound and radical trapping agent can be added, and mixed by any method that is capable of incorporating the components into the CMP composition. Typically, the radical-forming oxidizing agent is not added to the CMP composition until the composition is ready for use in a CMP process, for example, the oxidizing agent can be added just prior to initiation of polishing. The pH can be adjusted at any suitable time.

The CMP compositions of the present invention also can be provided as a concentrate, which is intended to be diluted with an appropriate amount of water prior to use. In such an embodiment, the CMP composition concentrate can include the various components dispersed or dissolved in aqueous solvent in amounts such that, upon dilution of the concentrate with an appropriate amount of solvent, each component of the polishing composition will be present in the CMP composition in an amount within the appropriate range for use.

The invention also provides a method of chemically-mechanically polishing a substrate comprising (i) contacting a substrate with a polishing pad and a CMP composition described herein, and (ii) moving the polishing pad relative to the substrate with the polishing composition therebetween, thereby abrading at least a portion of the substrate to polish the substrate.

The CMP methods of the present invention can be used to polish any suitable substrate, and is especially useful for polishing substrates comprising metallic components such as tungsten, copper, ruthenium, tantalum, and the like.

The CMP methods of the present invention are particularly suited for use in conjunction with a chemical-mechanical polishing apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and a CMP composition of the invention and then moving the polishing pad relative to the substrate, so as to abrade at least a portion of the substrate to polish the substrate.

A substrate can be planarized or polished with a CMP composition of the invention using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

Another aspect of the present invention is a method of enhancing the pot-life of a CMP composition including an amino compound and a radical-forming oxidizing agent. The method comprises adding to the CMP composition an amine oxidation-inhibiting amount of a radical trapping agent (i.e., a hydroxyl-substituted polyunsaturated cyclic compound, a nitrogenous compound, or a combination thereof). In the context of the present invention, an amine oxidation-inhibiting amount of a radical trapping agent is an amount sufficient to reduce the level of amine oxidation in the CMP composition by about 20 percent or more over a five day period of time after exposure of the amine component of the composition to a radical-forming oxidizing agent at an ambient temperature in the range of about 20 to 25° C.

The following examples further illustrate the invention but, of course, should not be construed as in any way limiting its scope.

EXAMPLE 1

This example illustrates the amine oxidation-inhibiting effectiveness of various radical trapping agents useful in the CMP compositions of the present invention.

A trapping agent was added to a slurry containing about 12 percent by weight colloidal silica, about 3 by weight hydrogen peroxide, about 1100 ppm benzotriazole (BTA), about 0.5 percent by weight potassium acetate, and about 80 ppm polyethylene glycol. The radical trapping agents evaluated and the amount of each radical trapping agent added are listed in Table 1. After five days the BTA level was measured using HPLC on a Waters 2695 with UV detection at 220 nm using a Waters 996 photo diode array and a gradient solvent profile.

The percent of BTA remaining after five days for each of the CMP compositions evaluated is recorded in Table 1.

The data in Table 1 indicate that only about 49% of the BTA remained in a control CMP composition without trapping agent after 5 days (Ex. 1A). By comparison, up to about 70% of BTA remained in Examples in which the radical trapping agent concentration was about 0.001 molar (e.g., using N-acetyl-5-methoxytryptamine as the radical trapping agent; Ex. 1L). At 0.005 molar concentration of radical trapping agent, up to about 88% of the BTA remained in the composition after 5 days (e.g., utilizing 1-nitroso-2-naphthol as the radical trapping agent, Ex. 1P). Surprisingly, at a 0.009 molar concentration of radical trapping agent, the level of BTA oxidation was essentially completely inhibited in the case of N-acetyl-5-methoxytryptamine (Ex. 1L) or 1-nitroso-2-naphthol as the radical trapping agent (Ex. 1P).

TABLE 1

Inhibition of Amine Oxidation by Radical Trapping Agents

| | | Percentage of BTA Remaining 5 Days After $H_2O_2$ Addition | | | |
|---|---|---|---|---|---|
| Ex. # | Trapping Agent Concentration: | 0.045M | 0.009M | 0.005M | 0.001M |
| 1A | None (Control) | 49% | 49% | 49% | 49% |
| 1B | TEMPO | | 87% | 77% | 61% |
| 1C | 4-methoxyphenol | | | | 62% |
| 1D | propyl gallate | | 70% | | |
| 1E | 3-hydroxy-2-naphthoic acid | 85% | | | |
| 1F | 4-methyl-7-hydroxycoumarin | 75% | | | |
| 1G | 2-hydroxypyridine | | 56% | | |
| 1H | 2,5-dihydroxy-1,4-benzoquinone | | 85% | 76% | 59% |
| 1I | Acid Blue 45 | | 84% | 84% | 68% |
| 1J | hydroquinone | | 72% | | |
| 1K | hydroquinone sulfonic acid, K salt | | 92% | | |
| 1L | N-acetyl-5-methoxytryptamine | | 98% | 92% | 70% |
| 1M | 2-methyl-4(5)-nitroimidazole* | 90% | 67% | 60% | |
| 1N | tris(hydroxymethyl)nitromethane | 87% | 69% | 69% | |
| 1O | 3,5-dinitrobenzoic acid | | 57% | 69% | |
| 1P | 1-nitroso-2-naphthol | | 92% | 88% | |
| 1Q | N-hydroxyphthalimide | | 102% | | |
| 1R | 1-(2-hydroxyethyl)piperazine* | | 92% | | |
| 1S | imidazole* | | 86% | | |
| 1T | acetanilide | 76% | 57% | 54% | |
| 1U | uric acid | | 58% | | |
| 1V | ascorbic acid (comparison) | | 65% | | |
| 1W | 3-hydroxypropionitrile (comparison) | 66% | | | |

*oxidizable to an N-oxide in the presence of hydrogen peroxide

EXAMPLE 2

This example illustrates the ability of radical trapping agents to inhibit amine oxidation as determined by measuring the zeta potential of colloidal silica particles present in the CMP composition. The zeta potential of the silica is related to the amount of amine compound remaining on the surface of the silica, which in turn is related to the shelf-life of the amino component in the presence of oxidizing agent.

The zeta potential of the fumed silica particles in each composition was obtained by measuring the electrophoretic mobility of the particles using a Malvern Zetasizer 3000, which has typical instrumental error of about ±5 mV in this system. The phenolic and nitrogenous radical trapping agents evaluated include 2-hydroxypyridine (at 285 and 950 ppm concentration, Ex. 2A and 2B, respectively), uric acid (504 ppm, Ex. 2C), N-methylmorpholine-N-oxide (702 ppm, Ex. 2D), 4-hydroxy TEMPO (516 ppm, Ex. 2E), and acetanilide (676 ppm, Ex. 2F). Compositions containing ascorbic acid (Ex. 2G) or no radical trapping agent (Ex. 2H) were also tested for comparison purposes. The formulations of the CMP compositions evaluated included about 0.5 percent by weight fumed silica, about 0.04 percent by weight of ferric nitrate nonahydrate, about 345 ppm of malonic acid, about 180 ppm of poly(2-methacryloxyethyltrimethylammonium bromide, and about 4 percent by weight of hydrogen peroxide, in addition to any radical trapping agent that may be present in the formulation. The results are presented graphically in FIG. 1. As is evident in FIG. 1, the radical trapping agents significantly decreased the drop in zeta potential over time.

EXAMPLE 3

This example illustrates the ability of radical trapping agents to stabilize amine-containing CMP compositions as determined by tungsten removal rates obtained by polishing tungsten wafers with freshly prepared CMP compositions, and compositions stored for 3 and 7 days after addition of hydrogen peroxide.

The compositions utilized were formulated substantially as described in Example 2. A composition without radical trapping agent (Ex. 3A, same formulation as Ex. 2H)) present was compared to compositions including 675 ppm of acetanilide (Ex. 3B) or 500 ppm of TEMPO (Ex. 3C). The wafers were polished on an Ebara FREX 200 mm polisher under the following operating conditions: IC1000 concentric k-grooved polishing pad on Suba IV, platen speed of 100 rpm, carrier speed of 55 rpm, sub-carrier pressure of 225 hectopascals (hPa) (3.2 pounds per square inch or "psi"), backside pressure of 225 hPa (3.2 psi), retainer ring pressure of 200 hPa (2.9 psi), slurry flow rate of 150 mL/minute.

Figure 2:
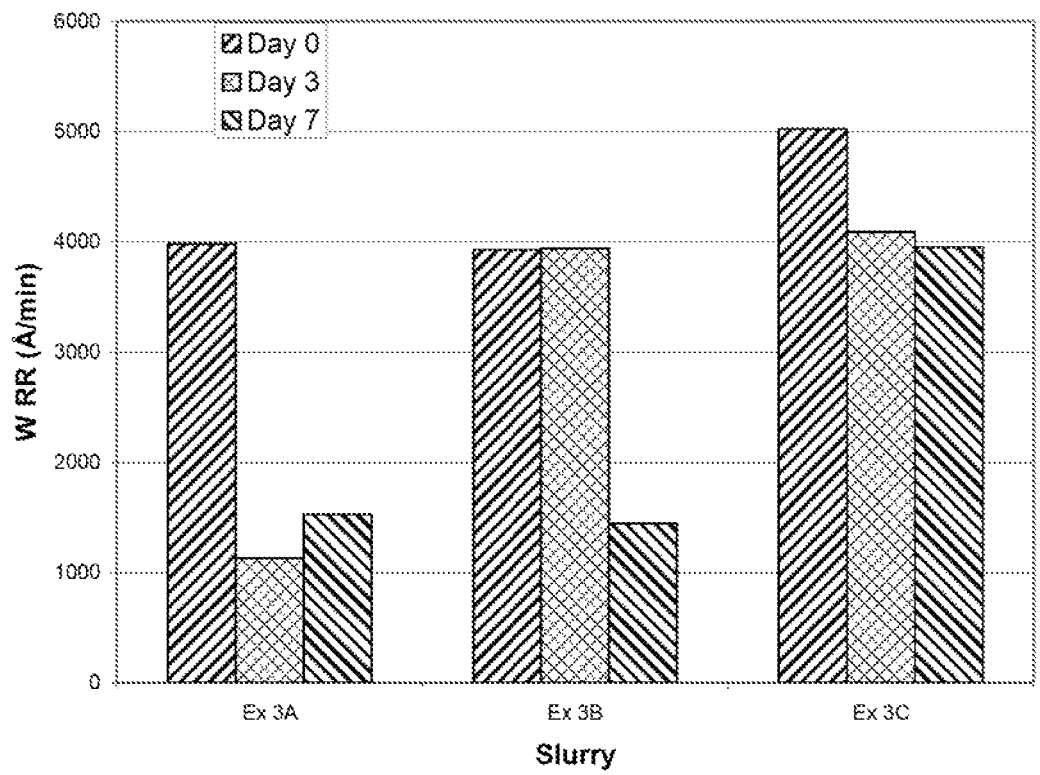
FIG. 2 is a bar graph of tungsten removal rate for various CMP compositions of the invention at increasing time periods after addition of hydrogen peroxide compared to a control composition without any radical trapping agent present.

The results are presented graphically in FIG. 2. The data in FIG. 2 indicate that TEMPO was able to stabilize the CMP compositions for up to 7 days compared to the control composition, whereas acetanilide stabilized the composition for up to 3 days.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context

What is claimed is:

1. A chemical-mechanical polishing (CMP) composition comprising:
   (a) an amino compound;
   (b) a radical-forming oxidizing agent;
   (c) a radical trapping agent capable of inhibiting radical-induced oxidation of the amino compound, the radical trapping agent wherein the radical trapping agent comprises a nitrogenous compound selected from the group consisting of an aromatic nitro compound, a heteroaromatic nitro compound, an aliphatic nitro compound, a nitroso compound, a nitrogen free radical-type compound, an N-oxide compound, an N-hydroxyl-imine compound, an acylamino-substituted aromatic compound, an N-acyl-enamine compound, and a combination of two or more of the foregoing nitrogenous compounds; and
   (d) an aqueous carrier therefor.

2. The CMP composition of claim 1 wherein the radical trapping agent comprises a hydroxyl-substituted polyunsaturated cyclic compound selected from the group consisting of a hydroquinone-type compound, a hydroxyl-substituted quinone compound, a hydroxyl-substituted coumarin compound, a hydroxyl-substituted naphthalene compound, an alkyloxy-substituted phenol compound, an alkyl-substituted phenol compound, a hydroxyl-substituted heteroaromatic compound, a sulfonic acid substituted phenolic compound, a salt thereof, and a combination of two or more of the foregoing compounds.

3. The CMP composition of claim 1 wherein the radical-forming oxidizing agent comprises at least one oxidizing agent selected from the group consisting of a peroxy compound and a halogen compound.

4. The CMP composition of claim 1 wherein the radical-forming oxidizing agent comprises hydrogen peroxide.

5. The CMP composition of claim 1 wherein the radical-forming oxidizing agent comprises a persulfate compound.

6. The CMP composition of claim 1 wherein the radical-forming oxidizing agent comprises iodine.

7. The CMP composition of claim 1 wherein the amino compound comprises at least one primary amine group, at least nitrogen-containing heterocyclic group, at least one quaternary ammonium group, or a combination of two or more of the foregoing.

8. The CMP composition of claim 1 wherein the composition further comprises a metal oxide abrasive.

9. The CMP composition of claim 8 wherein the metal oxide abrasive is selected from the group consisting of silica, alumina, titania, ceria, zirconia, and a combination of two or more of the foregoing abrasives.

* * * * *